United States Patent
Agrawal et al.

(10) Patent No.: US 6,191,612 B1
(45) Date of Patent: Feb. 20, 2001

(54) ENHANCED I/O CONTROL FLEXIBILITY FOR GENERATING CONTROL SIGNALS

(75) Inventors: Om P. Agrawal, Los Altos; Bradley A. Sharpe-Geisler; Giap Tran, both of San Jose, all of CA (US)

(73) Assignee: Vantis Corporation, Sunnyvale, CA (US)

(*) Notice: Under 35 U.S.C. 154(b), the term of this patent shall be extended for 0 days.

(21) Appl. No.: 09/196,449

(22) Filed: Nov. 19, 1998

(51) Int. Cl.[7] .................................................. H03K 19/177
(52) U.S. Cl. .................................................. 326/39; 326/41
(58) Field of Search .......................................... 326/31–41

(56) References Cited

U.S. PATENT DOCUMENTS

| | | | |
|---|---|---|---|
| 4,771,285 | 9/1988 | Agrawal et al. | 340/825.83 |
| 5,191,243 | 3/1993 | Shen et al. | 307/465 |
| 5,212,652 | * 5/1993 | Agrawal et al. | 326/41 |
| 5,362,999 | 11/1994 | Chiang | 326/44 |
| 5,504,439 | * 4/1996 | Tavana | 326/41 |
| 5,581,199 | 12/1996 | Pierce et al. | 326/41 |
| 5,617,041 | 4/1997 | Lee et al. | 326/39 |
| 5,689,195 | 11/1997 | Cliff et al. | 326/41 |
| 5,701,091 | * 12/1997 | Kean | 326/41 |
| 5,757,207 | 5/1998 | Lytle et al. | 326/39 |
| 5,880,598 | * 3/1999 | Duong | 326/41 |
| 5,903,165 | * 5/1999 | Jones et al. | 326/41 |
| 5,982,193 | * 11/1999 | Agrawal et al. | 326/41 |

FOREIGN PATENT DOCUMENTS 0 584 911 A1   3/1994   (EP).

\* cited by examiner

*Primary Examiner*—Michael Tokar
*Assistant Examiner*—Don Phu Le
(74) *Attorney, Agent, or Firm*—Fliesler Dubb Meyer & Lovejoy

(57) ABSTRACT

A Field Programmable Gate Array (FPGA) device includes a plurality of input/output blocks (IOBs) and variable grain blocks (VGBs). An inter-connect network provides efficient and flexible routing of control signals from VGBs to IOBs. Control signals may include individual control signals to a predetermined IOB or common control signals to a plurality of IOBs. The inter-connect network includes vertical and horizontal inter-connect channels. The inter-connect channels are coupled to switch boxes having line segments or stubs. The line segments are coupled to an IOB control multiplexer which output control signals to IOBs. The use of stubs allows for efficient and flexible use of interconnect resources.

11 Claims, 14 Drawing Sheets

ENHANCED I/O CONTROL FLEXIBILITY FOR GENERATING CONTROL SIGNALS

BACKGROUND

1. Field of the Invention

The invention is generally directed to integrated circuits, more specifically to Programmable Logic Devices (PLDs), and even more specifically to a subclass of PLDs known as Field Programmable Gate Arrays (FPGAs).

2a. Cross Reference to Related Applications

The following copending U.S. patent applications are assigned to the assignee of the present application, and their disclosures are incorporated herein by reference:

(A) Ser. No. 08/828,520 filed Apr. 1, 1997 by Bradley A. Sharpe-Geisler and originally entitled, "MEMORY BITS USED TO COUPLE LOOK UP TABLE INPUTS TO FACILITATE INCREASED AVAILABILITY TO ROUTING RESOURCES PARTICULARLY FOR VARIABLE SIZED LOOK UP TABLES FOR A FIELD PROGRAMMABLE GATE ARRAY (FPGA)";

(B) Ser. No. 08/931,798, filed Sep. 16, 1997 by Bradley A. Sharpe-Geisler and originally entitled, "CIRCUITRY TO PROVIDE FAST CARRY";

(C) Ser. No. 08/912,763 filed Aug. 18, 1997, by Bradley A. Sharpe-Geisler and originally entitled, "OUTPUT BUFFER FOR MAKING A 2.5 VOLT CIRCUIT COMPATIBLE WITH A 5.0 VOLT CIRCUIT";

(D) Ser. No. 08/948,306 filed Oct. 9, 1997, by Om Agrawal et al. and originally entitled, "VARIABLE GRAIN ARCHITECTURE FOR FPGA INTEGRATED CIRCUITS";

(E) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(F) Ser. No. 08/996,049 filed Dec. 22, 1997, by Om Agrawal et al. and originally entitled, "DUAL PORT SRAM MEMORY FOR RUN-TIME USE IN FPGA INTEGRATED CIRCUITS";

(G) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(H) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(I) Ser. No. 08/995,612 filed Dec. 22, 1997, by Om Agrawal et al. and originally entitled, "FLEXIBLE DIRECT CONNECTIONS BETWEEN INPUT/OUTPUT BLOCKS (IOBS) AND VARIABLE GRAIN BLOCKs (VGBs) IN FPGA INTEGRATED CIRCUITS";

(J) Ser. No. 08/996,119 filed Dec. 22, 1997, by Bradley Sharpe-Geisler and originally entitled, "MULTIPLE INPUT ZERO POWER AND/NOR GATE FOR USE WITH A FIELD PROGRAMMABLE GATE ARRAY (FPGA)"; and, (K) Ser. No. 08/996,442 filed Dec. 22, 1997, by Bradley Sharpe-Geisler and originally entitled, "INPUT BUFFER PROVIDING VIRTUAL HYSTERESIS".

2b. Cross Reference to Related Patents

The following U.S. patents are assigned to the assignee of the present application, and their disclosures are incorporated herein by reference:

(A) U.S. Pat. No. 5,212,652 issued May 18, 1993 to Om Agrawal et al. and entitled, PROGRAMMABLE GATE ARRAY WITH IMPROVED INTER-CONNECT STRUCTURE;

(B) U.S. Pat. No. 5,621,650 issued Apr. 15, 1997 to Om Agrawal et al. and entitled, PROGRAMMABLE LOGIC DEVICE WITH INTERNAL TIME-CONSTANT MULTIPLEXING OF SIGNALS FROM EXTERNAL Interconnect BUSES;

(C) U.S. Pat. No. 5,185,706 issued Feb. 9, 1993 to Om Agrawal et al. and entitled, PROGRAMMABLE GATE ARRAY WITH LOGIC CELLS HAVING CONFIGURABLE OUTPUT ENABLE; and (D) U.S. Pat. No. 5,740,069 issued Apr. 14, 1998 to Om Agrawal et al. and entitled, PROGRAMMABLE LOGIC DEVICE (PLD) HAVING DIRECT CONNECTIONS BETWEEN CONFIGURABLE LOGIC BLOCKS (CLBs) AND CONFIGURABLE INPUT/OUTPUT BLOCKS (IOBs) (as a continuing divisional with chained cross referencing back to Ser. No. 07/394,221 filed Aug. 15, 1989).

3. Description of Related Art

Field-Programmable Logic Devices (FPLDs) have continuously evolved to better serve the unique needs of different end-users. From the time of introduction of simple PLDs such as the Advanced Micro Devices 22V10 Programmable Array Logic device (PAL), the art has branched out in several different directions.

One evolutionary branch of FPLDs has grown along a paradigm known as Complex PLDs or CPLDs. This paradigm is characterized by devices such as the Advanced Micro Devices MACH family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGAs. Examples of such devices include the XC2000 and XC3000 families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOBs) are provided for interconnecting other internal circuit components of the FPGA device with external circuitry. The IOBs' may have fixed configurations or they may be configurable in accordance with user-provided configuration instructions stored in the configuration-defining memory means.

(3) Configurable Logic Blocks (CLBs) are provided for carrying out user-programmed logic functions as defined by user-provided configuration instructions stored in the configuration-defining memory means. Typically, each of the many CLBs of an FPGA has at least one lookup table (LUT) that is user-configurable to define any desired truth table, —to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An inter-connect network is provided for carrying signal traffic within the FPGA device between various CLBs and/or between various IOBs and/or between various IOBs and CLBs. At least part of the inter-connect network is typically configurable so as to allow for programmably-defined routing of signals between various CLBs and/or IOBs in accordance with user-defined routing instructions stored in the configuration defining memory means. Switch boxes are typically used to route signals in the inter-connect network. For example, a switch box may route a signal on a horizontal positioned inter-connect resource to an inter-connect resource positioned vertically. Likewise, a switch box may route a signal on a particular inter-connect resource to a different type of inter-connect resource. Another part of the inter-connect network may be hard wired or nonconfigurable such that it does not allow for programmed definition of the path to be taken by respective signals traveling along such hard wired inter-connect. A version of hard wired inter-connect wherein a given conductor is dedicatedly connected to be always driven by a particular output driver, is sometimes referred to as 'direct connect'.

Modern FPGAs tend to be fairly complex. They typically offer a large spectrum of user-configurable options with respect to how each of many CLBs should be configured, how each of many inter-connect resources should be configured, and how each of many IOBs should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

Typically, FPGA devices are not designed to flexibly and efficiently provide input/output ("I/O") control signals to IOBs from CLBS. In particular, FPGA devices are not constructed such that a control signal may be routed to a wide range of possible IOBs without consuming a large amount of inter-connect resources. A particular configuration of an FPGA may require a common control signal to be provided to a large number of IOBS, where another FPGA configuration may require each IOB have an individual control signal. Similarly, an FPGA configuration may require a combination of common and individual control signals. Similarly, FPGA designers have not typically constructed an inter-connect network and other FPGA device features based on the likely source of the control signals within the FPGA device.

Accordingly, it is desirable to provide a FPGA device which provides different types of I/O control signals to a wide range of possible IOBs without unduly consuming inter-connect resources. Similarly, it is desirable to provide an inter-connect network for efficiently providing control signals from likely sources within the FPGA device.

SUMMARY OF THE INVENTION

An improved inter-connect network architecture in accordance with the invention features programmably configured connections between a repeating pattern of logic-implementing, Variable Grain Blocks or 'VGBs' and Input/Output blocks 'IOBs'.

In an embodiment of the present invention, the inter-connect network includes switch boxes and inter-connect resources for providing I/O control signals to IOBs. Switch boxes include stubs, or line segments, connected to various types of inter-connect resources. Programmable inter-connect points ("PIPs") are used in the switch box for programmably configuring inter-connect lines in the inter-connect network. Switch boxes are coupled to an IOB control multiplexer which routes common and individual control signals to IOBs.

In another embodiment, a plurality of IOBs are arranged along the periphery of the matrix distributed super-VGBs. The plurality of IOBs include a set of top (north), right (east), bottom (south), and left (west) IOBs, forming an approximate square perimeter around the periphery of super-VGBs. The plurality of IOBs include corner and non-corner IOBs. In an embodiment, corner IOBs include 12 IOBs forming a corner of the square perimeter. In an embodiment, non-corner IOBs are IOBs not included in corner IOBs which are used to form a side of the square perimeter.

In still another embodiment, each super-VGB is surrounded by diversified set of inter-connect resources. The inter-connect resources include vertical and horizontal inter-connect channels. The inter-connect channels include a plurality of inter-connect elements such as: general bi-directional inter-connect lines of varying lengths; switch boxes that provide programmable inter-connections between the general bi-directional inter-connect lines; and uni-directional programmably configured direct connect lines. The general bi-directional inter-connect lines include MaxL lines which span essentially the full workable length of the FPGA device along one of its major axes (e.g., the horizontally-extending x axis or the vertically-extending y axis). Double, quad and octal inter-connect lines are also provided.

According to another aspect of the present invention, IOB control multiplexers are positioned adjacent groups of IOBs and coupled to inter-connect channels positioned substantially perpendicular to the group of IOBs. In an embodiment, the IOB control multiplexers are used to provide common and individual control signals to three IOBs. In an embodiment, a first IOB control multiplexer has inputs coupled to two inter-connect channels and outputs coupled to three IOBs. The IOB control multiplexer provides common CLKX signals (INPUT CLOCK, INPUT CLKEN, OUTPUT CLOCK, OUTPUT CLKEN) and a common SET/RST signal (Common Set/Reset) to the three IOBs. Individual IOB control signals, such as OUTPUT and INPUT ENX signals, are provided to the three IOBs from the IOB multiplexer by way of a first and second inter-connect channel. The IOB control multiplexers include PIPs for programmably configuring adjacent inter-connect lines ("AILs") in the first and second inter-connect channels, SET/RST line, $V_{CC}$ line, GND lines and CLKX lines to multiplexer input lines ("MILs"). The MIL lines are either connected directly to respective IOB input lines and/or logic which is coupled directly to IOB input lines.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
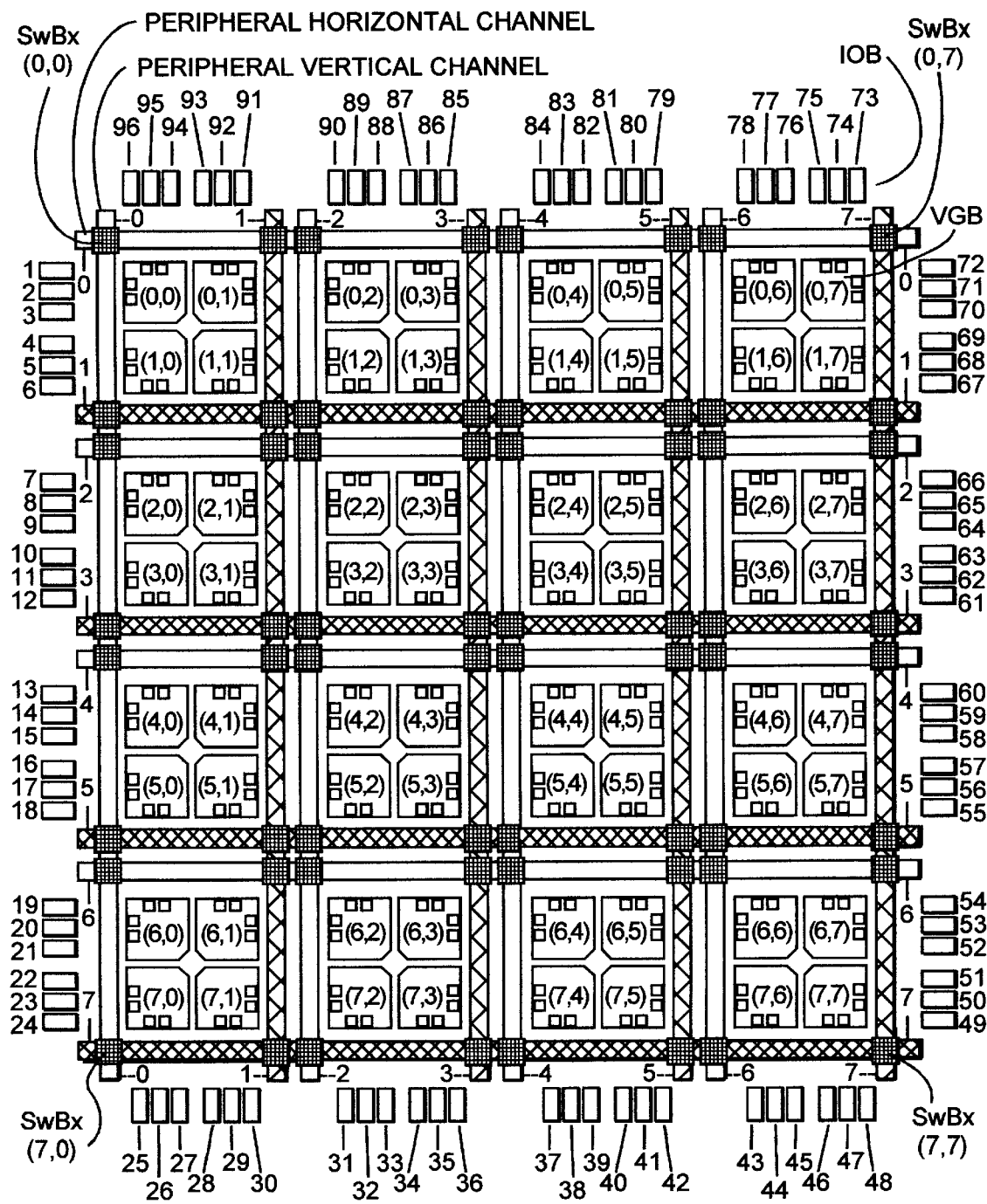
FIG. 1 illustrates a first FPGA in accordance with the invention having an 8×8 matrix of VGBs (a 4×4 tiled matrix of super-VGBs and surrounding inter-connect resources)

A number of FPGA terms will be used throughout the specification. The term 'CLB' as used herein generally refers to a Boolean function generating block whose structure is essentially repeated throughout the device. Each CLB usually has at least one programmable lookup table (LUT), but may have more LUTs. Each CLB may have other resources such as data-storage elements (e.g., flip flops) and local feedback means for creating sequential state machines.

The term 'inter-connect network' as used herein generally refers to a repeated pattern of connection-providing resources which carry signal traffic between CLBs. An analogy can be made to the mesh of public highways (expressways) and public streets that carry vehicle traffic in modern cities. The inter-connect mesh of an FPGA may also include connection-providing resources that can carry signal traffic between CLBs and input/output blocks (IOBs). As used herein, 'IOB' refers to a repeated structure that provides interface between points outside the FPGA device and FPGA-internal components.

The term 'intra-connection' resources (note the 'ra' sequence before the hyphen) is used herein to refer to connection-providing resources that are dedicated to carrying signals essentially only inside a particular entity such as a CLB or an IOB. Such intra-connection resources are to be distinguished from 'inter-connection resources' (note the 'er' sequence before the hyphen). In general, intraconnection is a relative term which should accompany the entity to which it is dedicated. Thus CLB-intraconnection refers to connection resources that are dedicated to carrying signals essentially only inside a particular CLB.

The term 'inter-connection resources' is used herein to refer to connection-providing resources that can carry signals between two or more CLBs and/or between two or more IOBs and/or between a CLB and an IOB.

To distinguish intra-connection resources over inter-connection resources, an analogy can be made to the private driveway of a private house as distinguished from an adjacent public highway (expressway) or an adjacent public street, where the latter generally carries passing-by general traffic as well as private traffic of the private driveway.

Inter-connection resources in the FPGA include both those that provide programmable routing of signals between any desired CLBs and/or IOBs and those that provide fixed routing (hardwired transmission) of signals between specific IOBs and/or specific CLBs. One type of fixed-route inter-connect resource is a line that is always (fixedly) driven by a dedicated output but can have its carried signal programmably coupled to one or more inputs. Such unidirectional, fixed-route lines are generally referred to herein as 'direct connect lines'.

Inter-connect resources which provide programmably-definable routing of signals between CLBs and/or IOBs can include 'maximum length' lines (MaxL lines) which span essentially the full workable length of the FPGA device along one of its major axes (e.g., the horizontally-extending x axis or the vertically-extending y axis). MaxL lines are also referred to as 'longlines'.

The programmably-configurable inter-connect resources can further include 'short-haul segments' which extend for lengths significantly less than those of the longlines. Short-haul segments generally terminate on both ends at inter-connect 'switch boxes'. The switch boxes provide programmably-definable inter-connections between terminal ends of short-haul connectors merging into the switch boxes.

Once a specific inter-connect line is 'consumed' for carrying a first signal, that inter-connect resource cannot be used to at the same time carry a second signal. Similarly, once a specific, logic function-providing resource is 'consumed' for carrying out a first logic function, that same logic function-providing resource cannot be used to at the same time carry out a completely different, second logic function.

FIG. 1 shows a view of an FPGA device 800 in accordance with the invention. The illustrated structure is formed on a monolithic integrated circuit. In one embodiment having a matrix of 20-by-20 VGBs, the integrated circuit is formed on a semiconductor die having an area of about 120,000 mils$^2$ or less. The integrated circuit includes at least five metal layers for forming inter-connect. The direct connect lines and longlines of the inter-connect are preferably implemented entirely by the metal layers so as to provide for low resistance pathways and thus relatively small RC time constants on such inter-connect lines. Logic-implementing transistors of the integrated circuit have channel lengths of 0.35 microns or less. Amplifier output transistors and transistors used for interfacing the device to external signals may be larger, however.

FPGA device 800 is defined as a regular matrix. In the illustrated embodiment there are four super-VGBs in each row and also four super-VGBs in each column. Each super-VGB contains four VGBs. Each super-VGB is bounded by two horizontal and two vertical inter-connect channels (HICs and VICs). This combination of super-VGB and surrounding inter-connect resources is tiled as seen. The tiling provides adjacent pairs of inter-connect channels within the core of the device 800. Peripheral channels (HIC0, HIC7, VIC0, VIC7) are not paired. Switch boxes are shown at the intersection of vertical and horizontal inter-connect channels. Corner switch boxes SwBx (0,0), SwBx (0,7), SwBx (7,7), and SwBx (7,0) (as well as other switch boxes not specifically referenced) are shown at the intersections of the respective vertical and horizontal inter-connect channels of FPGA device 800. The switch boxes are further illustrated in FIGS. 2 and 3A–D. In one embodiment, the switch boxes use the bootstrapped transmission gate circuit of FIG. 4C for forming programmable configurations through such switch boxes.

At the periphery of the FPGA device 800, there are three input/output blocks (IOBs) for each row of VGBs and for each column of VGBs. The IOBs in the illustrated embodiment are shown numbered from 1 to 96. The VGBs are numbered according to their column and row positions. The centrally-shared resources of each super-VGB are represented by the diamond-shaped hollow at the center of each super-VGB. Longline driving amplifiers are understood to occupy these diamond-shaped hollows to have their respective outputs coupling vertically and horizontally to the adjacent HICs and VICs of their respective super-VGBs.

Each super-VGB in FIG. 1 has four CBBs along each of its four sides. The four CBBs of each such inter-connect-adjacent side of the super-VGBs can store a corresponding four bits of data in their respective CSEs so as to define a nibble of data for output onto the adjacent inter-connect lines. Each VGB contains four CBBs which can acquire and process a nibble's worth of data. One of these processes is nibble-wide addition within each VGB. Another of these processes is implementation of a 4:1 multiplexer. The presentation of CBBs in groups of same number (e.g., 4 per side of a super-VGB and 4 within each VGB) provides for a balanced handling of multi-bit data packets along rows and columns of the FPGA matrix. For example, nibbles may be processed in parallel by one column of CBBs and the results may be efficiently transferred in parallel to an adjacent column of CBBs for further processing. One more specific example is formation of a barrel-shifter in one or more columns of CBBs (using implemented 4:1 multiplexers) followed by formation of an adder with self feedback in an adjacent column of VGBs. The combination can define an efficiently packed, binary multiplier. The horizontal inter-connect can carry multiplication results in parallel to further, column oriented circuits as appropriate by way of a diversified set of different-length inter-connect lines.

Figure 2:
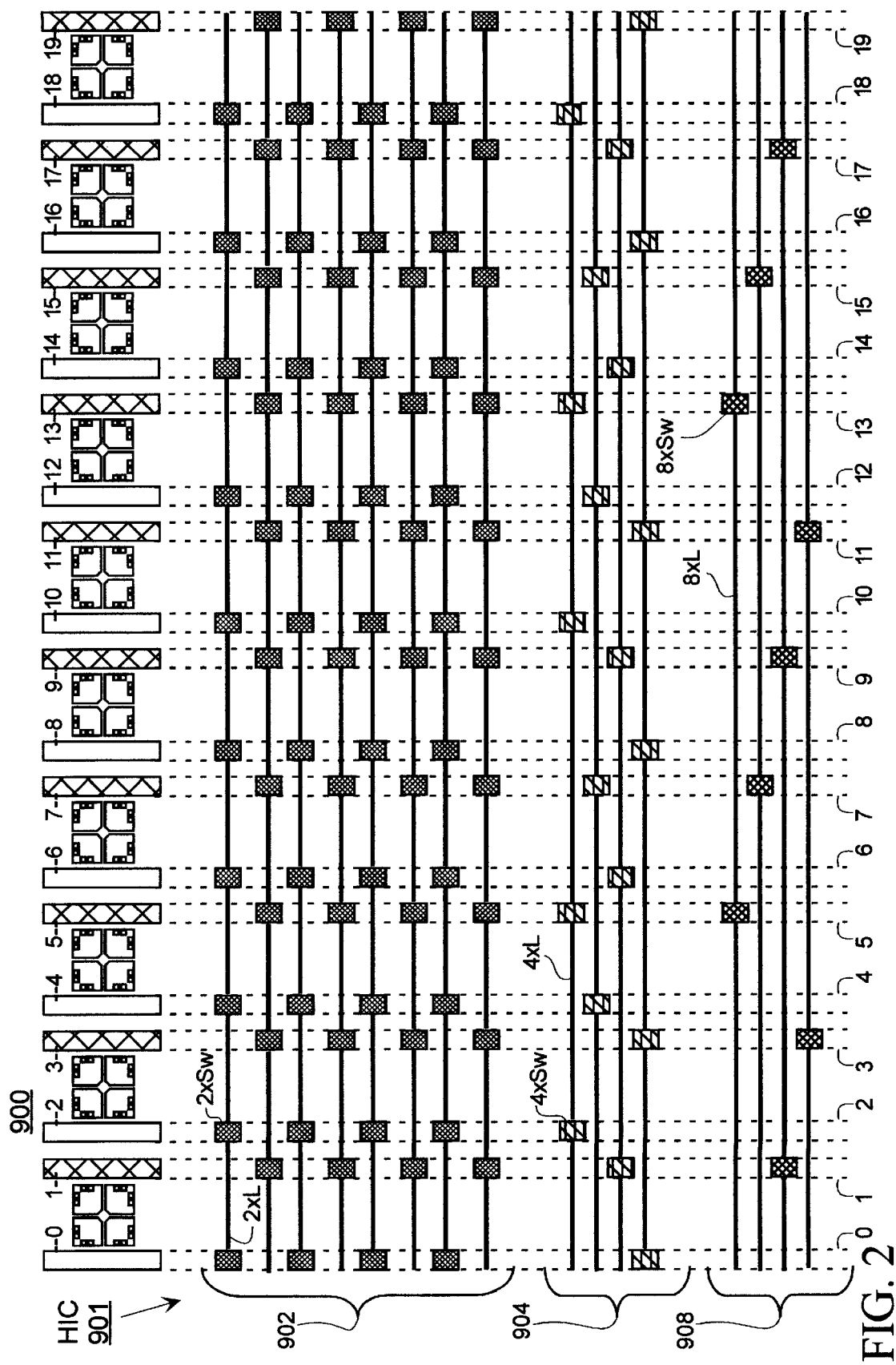
FIG. 2 shows a distribution of different-length horizontal inter-connect lines (2×L, 4×L, 8×L) and associated switch boxes as aligned relative to vertical inter-connect channels in a 20×20 matrix of VGBs (10×10 super-VGBs)

FIG. 2 shows a distribution 900 of different-length horizontal inter-connect lines ("double" 2×L, "quad" 4×L, "octal" 8×L) and associated switch boxes of a single horizontal inter-connect channel (HIC) 901, as aligned relative to vertical inter-connect channels in an FPGA of the invention. This particular FPGA has a 20×20 matrix of VGBs (10×10 super-VGBs). Core channels 1 through 18 are laid out as adjacent pairs of odd and even channels. Peripheral channels 0 and 19 run alone along side IOBs (See FIG. 1).

HIC 901 is understood to have 58 lines containing the following resources: eight double-length (2×L) lines, four quad-length (4×L) lines, four octal-length (8×L) lines, sixteen full-length (MaxL) lines, sixteen direct-connect (DC) lines, eight feedback (FB) lines and two dedicated clock (CLK) lines. However, only the eight 2×L lines, the four 4×L lines, and the four 8×L lines of HIC 901 are shown in FIG. 2.

Group 902 represents the 2×L lines of HIC 901 and their corresponding switch boxes. All 2×L lines span the distance of essentially two adjacent VGBs. Most 2×L lines terminate at both ends into corresponding 2× switch boxes (2×Sw's). The terminating 2×Sw boxes are either both in even-numbered channels or both in odd-numbered channels. Exceptions occur at the periphery where either an odd or even-numbered channel is nonexistent. As seen in embodiment 900, inter-connections can be made via switch boxes from the 2×L lines of HIC 900 to any of the odd and even-numbered vertical inter-connect channels (VICs) 0–19.

Group 904 represents the 4×L lines of HIC 901 and their corresponding switch boxes. Most 4×L lines span the distance of essentially four, linearly-adjacent VGBs and terminate at both ends into corresponding 4× switch boxes (4×Sw's). The terminating 4×Sw boxes are either both in even-numbered channels or both in odd-numbered channels. As seen in embodiment 900, inter-connections can be made via switch boxes from the 4×L lines of HIC 900 to any of the odd and even-numbered vertical inter-connect channels (VICs) 0–19.

Group 908 represents the 8×L lines of HIC 901 and their corresponding switch boxes. Most 8×L lines (7 out of 12) span the distance of essentially eight, linearly-adjacent VGBs. A fair number of other 8×L lines (5 out of 12) span distances less than that of eight, linearly-adjacent VGBs. Each 8×L line terminates at least one end into a corresponding 8× switch box (8×Sw). The terminating 8×Sw boxes are available in this embodiment only in the core odd-numbered channels (1, 3, 5, 7, 9, 11, 13, 15 and 17). Thus, in embodiment 900, inter-connections can be made via switch boxes from the 8×L lines of HIC 900 to any of the nonperipheral, odd-numbered vertical inter-connect channels (VICs).

Figure 4A:
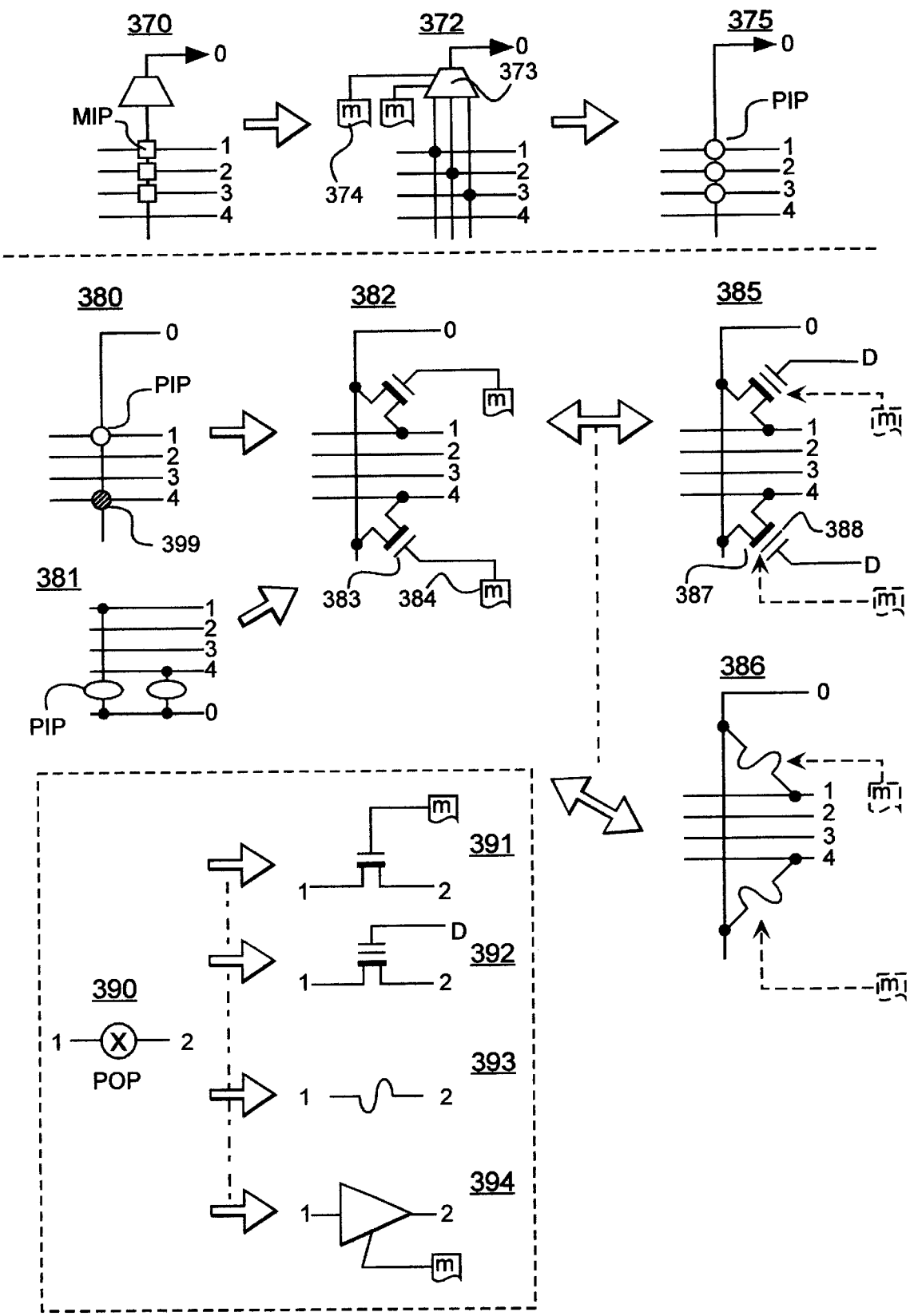
FIG. 4A provides a legend for some schematic symbols used in the present disclosure.

Before exploring details of the switch boxes, the legend of FIG. 4A will be explained. Unless otherwise stated, a single line going into a multiplexer symbol such as shown at 370 of FIG. 4A represents an input bus of plural wires. Each open square box such as the MIP shown at 370 represents a point for user-configurable acquisition of a signal from the crossing line (e.g., 1, 2, 3). One implementation is shown at 372. Multiplexer 373 is controlled by configuration memory bits 374. The number of configuration memory bits 374 can vary depending on the number of MIPs (multiplexer input points) and whether selection decoding is carried out or not. One embodiment that has no selection decoding is shown at 375. Here, a PIP is placed at each MIP occupied intersection of output line 0 with crossing lines 1–4. Each of these PIPs is understood to have a single configuration memory bit controlling its state. In the active state the PIP creates a connection between the crossing lines. In the inactive state the PIP leaves an open between the illustrated crossing lines. Each of the crossing lines remains continuous however in its respective direction (x or y). In an alternate embodiment, shaded PIPs, such as PIP 399, in the inactive state, create a connection between the crossing lines. In the active state, the PIP leaves an pen between the crossing lines.

PIPs (each of which is represented by a hollow or shaded circle covering a crossing of two continuous lines) may be implemented in a variety of manners as is well known in the art. Two PIPs are shown at 380 for programmably creating a coupling between line 0 and respective ones of lines 1 and 4. In one embodiment shown at 382, pass transistors such as MOSFET 383 have their source and drain coupled to the crossing lines while the transistor gate is controlled by a configuration memory bit such as 384. In an alternate embodiment shown at 385, nonvolatilly-programmable floating gate transistors such as 387 have their source and drain coupled to the crossing lines. The charge on the floating gate 388 represents the configuration memory bit. A dynamic signal D or a static turn-on voltage may be applied to the control gate as desired. In yet another alternate embodiment shown at 386, nonvolatilly-programmable fuses or anti-fuses have their ends connected to the crossing lines. Each of examples 382, 385 and 386 demonstrates a bidirectional PIP for which signal flow between the crossing lines (e.g., 0 and 1) can move in either direction. Where desirable, PIPs can also be implemented with unidirectional signal coupling means such as AND gates, tri-state drivers (see 394), and so forth.

An alternate symbol for a PIP is constituted by a hollow ellipse covering a strapping connection between two parallel lines such as shown at 381. The schematic of 381 is an alternate way of representing the circuit of 380.

Another symbol used herein is the POP such as shown at 390. POP stands for 'Programmable Opening Point' and it is represented by a hollow circle with an 'X' inside. Unless otherwise stated, each POP is understood to have a single configuration memory bit controlling its state. In the active state the POP creates an opening between the collinear lines (1,2) entering it. In the inactive state the POP leaves closed an implied connection between the collinear lines (1,2) entering it. Possible implementations of POPs are shown at 391 through 394. In EEPROM implementation 392, the control gate signal D will be typically tied to the channel-inducing state so that the charge on the floating gate controls the POP state exclusively. The tri-state driver implementation of 394 is unidirectional of course. Many other alternatives will be apparent to those skilled in the art.

Figure 4B:
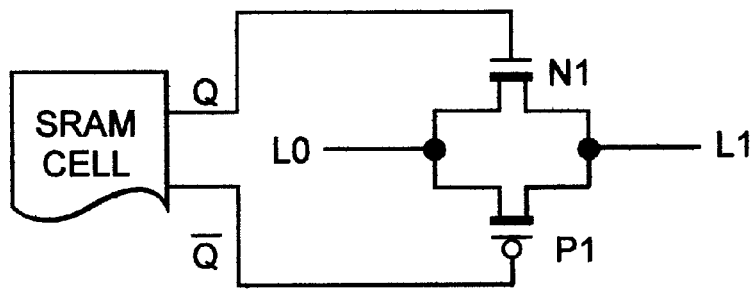
FIGS. 4B and 4C provide schematics for transmission gate type PIPs (programmable inter-connect points) driven by complementary outputs of an SRAM bit.

FIG. 4B shows yet another implementation of a bidirectional PIP at 395. Lines L0 and L1 are the programmably inter-connectable entities. In this particular case, the controlling memory is an SRAM bit (Static Random Access Memory) having opposed Q and Q-bar outputs. The Q output drives the gate of an N-channel MOSFET, N1 of the PIP. The Q-bar output drives the gate of an P-channel MOSFET, P_1 of the PIP. In general, transistor P_1 should be made with a larger channel width than that of transistor N_1 to compensate for the lower mobility of carriers in the P-channel of the P_1 device.

Figure 4C:
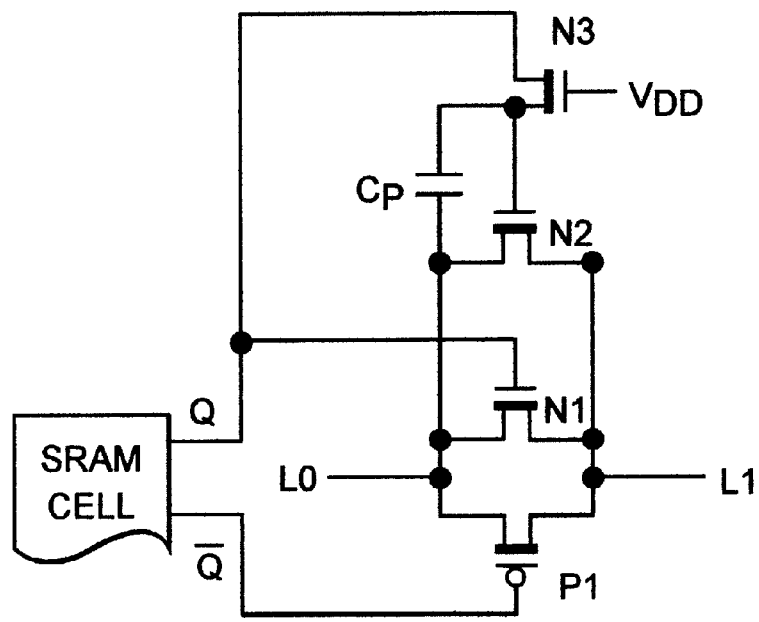

FIG. 4C shows yet another implementation of a bidirectional PIP at 398. Like reference symbols are used where appropriate for elements having like counterparts in FIG. 4C. The PIP shown at 398 may be referred to as a boot-strapped transmission gate. The parasitic gate-to-source capacitance $C_P$ of additional N-transistor N_2 may be used improve the conductivity of the PIP between L0 and L1 when Q is high (and Q-bar is at a lower voltage) and a low-to-high transition appears at L0 for transmission onto L1. Capacitance $C_P$ couples the low-to-high transition to the gate of N_2. N_3 had pre-established a slightly below threshold voltage on the gate of N_2 by virtue of N_3 having its drain coupled to the high Q, the source of N_3 being connected to the gate of N_2, and the gate of N_3 being coupled to $V_{DD}$, the high voltage rail of the device. The capacitively coupled low-to-high transition boosts the voltage of N_2's gate above threshold and turns N_2 on. This assists the normally slower P_1 device with passing the low-to-high transition from L0 to L1. As such P_1 can be made with a channel width that is comparatively smaller than the width used for the PMOS device in the PIP 395 of FIG. 4B.

In an embodiment, shaded PIPs may be utilized by switching the Q and Q-bar input signals to the circuits illustrated in FIGS. 4B–4C.

FIGS. 3A–D illustrate corner switch boxes for the inter-connect network of FPGA device 800 illustrated in FIG. 1. In an embodiment, the numbered dots are hollow PIPs. In particular, FIGS. 3A–D illustrate switch boxes SwBx (0,0), SwBx (0,7), SwBx (7,7) and SwBx (7,0), respectively. In an embodiment, these switch boxes represent the switch boxes only at the peripheral of FPGA device 800. For example, switch boxes at the intersection of VIC(0) and HIC(2), HIC(4), HIC(6) have similar architecture to switch box SwBx (0,0) shown in FIG. 3A. The switch boxes include PIPs for configuring connections between inter-connect resources. These switch boxes also include line segments or stubs for connecting inter-connect resources running substantially parallel to adjacent IOBs. In an embodiment, these inter-connect resources carry common and individual control signals. The connection of adjacent inter-connect resources to particular stubs in switch boxes are selected based upon the likely source of control signals from internal VGBs. Stubs are selected such that they may be connected to a variety of MaxL lines which can be driven by VGBs on the periphery of FPGA device 800. Thus, a single VGB may drive a MaxL line which may be connected to all the IOBs, by way of stubs, on a side of FPGA device 800.

Figure 3A:
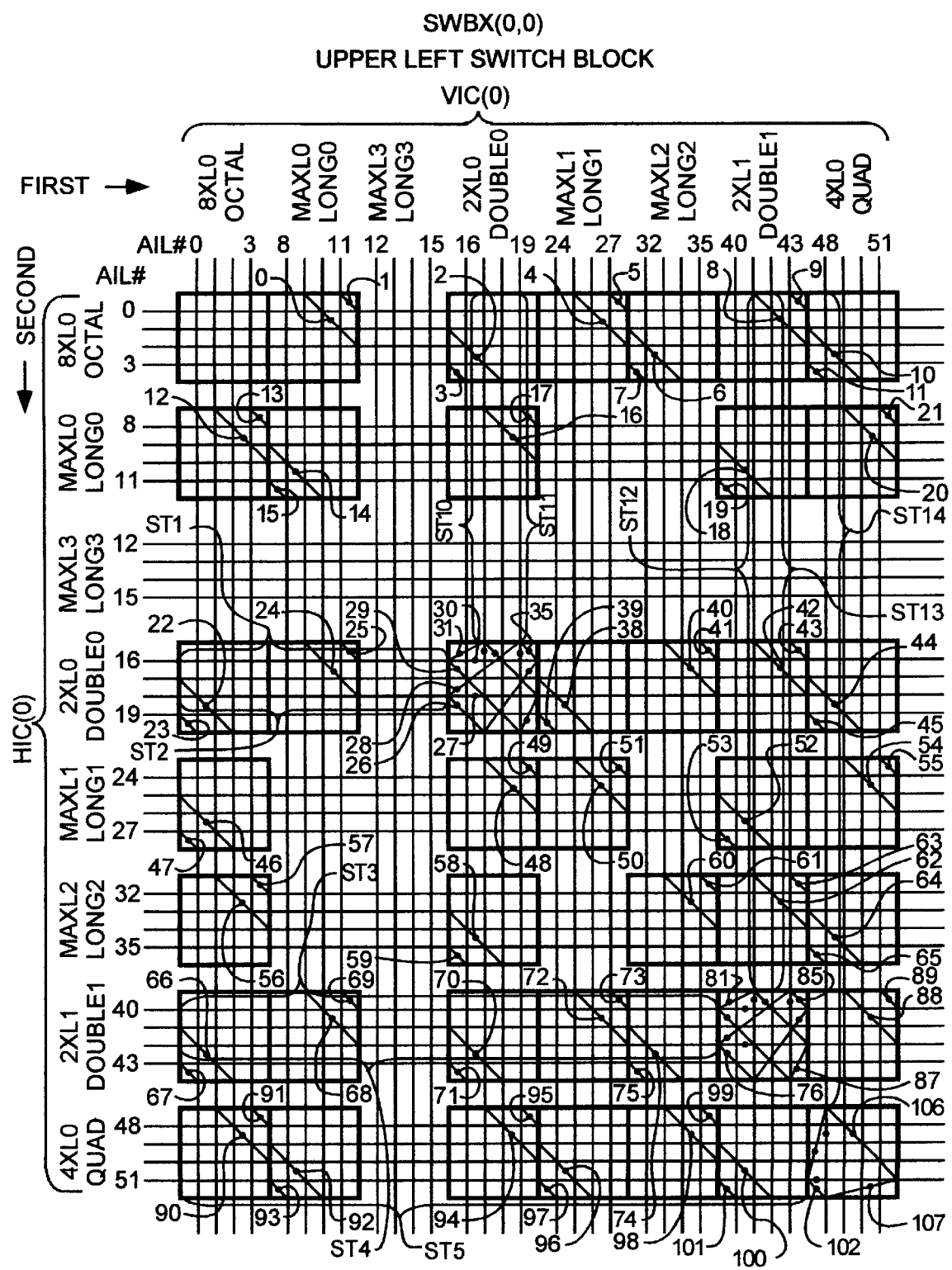
FIGS. 3A–D illustrate peripheral inter-connect switch boxes.

As can be seen from FIG. 3A, SwBx (0,0) provides inter-connections between VIC(0) and HIC(0). VIC(0) includes AILs 0–51 for connecting to AILs 0–51 in HIC(0). In an embodiment, portions of HIC(0) and VIC(0) are used as stubs. In particular, line segment ST1 of AIL16, line segment ST2 of AIL18, line segment ST3 of AIL40, line segment ST4 of AIL42 and line segment ST5 of AIL51 in HIC(0) are used as stubs in routing signals on VIC(0) to IOBs positioned on the left side of FPGA device 800.

As can be seen, three different length stubs are formed. In an embodiment, IOBs 1–3 will be connected by way of an IOB multiplexer to AILs 16, 18, 40, 42 and 51 of HIC(0). For example, signals on a Long line or AIL 11 in VIC(0) may be transferred to AIL16 on line segment ST1 by activating PIP 25. In an embodiment, PIPs 29, 30, and 31 would not be active thus not transfer the signal to the right side of AIL16 (or the non line segment portion of AIL16 in HIC(0).

A similar connect may be used for stubs on VIC(0). In particular, line segment ST10 of AIL17, line segment ST11 of AIL19, line segment ST12 of AIL41, line segment ST13 of AIL43 and line segment ST14 of AIL48 are used as stubs in routing signals on HIC(0) to IOB multiplexer on the top of FPGA device 800.

The present invention allows for a number of advantages. This use of stubs allows for inter-connect resources which extend along the edge of FPGA device 800 and are adjacent to VGBs to carry control signals to peripheral IOBs. The use of stubs enables other inter-connect resources to be available for other signals. For example, if stubs were not used, other interconnect resources in an interconnect channel would be required to provide a control signal to a plurality of IOBs on a side of the FPGA device rather than a signal long line and a plurality of stubs. Second, without the use of stubs, IOB control multiplexers would have to be larger in order to be configurable to additional interconnect resources. In order to ascertain the same flexibility of the present invention, multiple long lines would have to be configurable to additional PIPs in an IOB control multiplexer. Third, the use of additional PIPs would also increase signal propagation times.

Figure 3B:
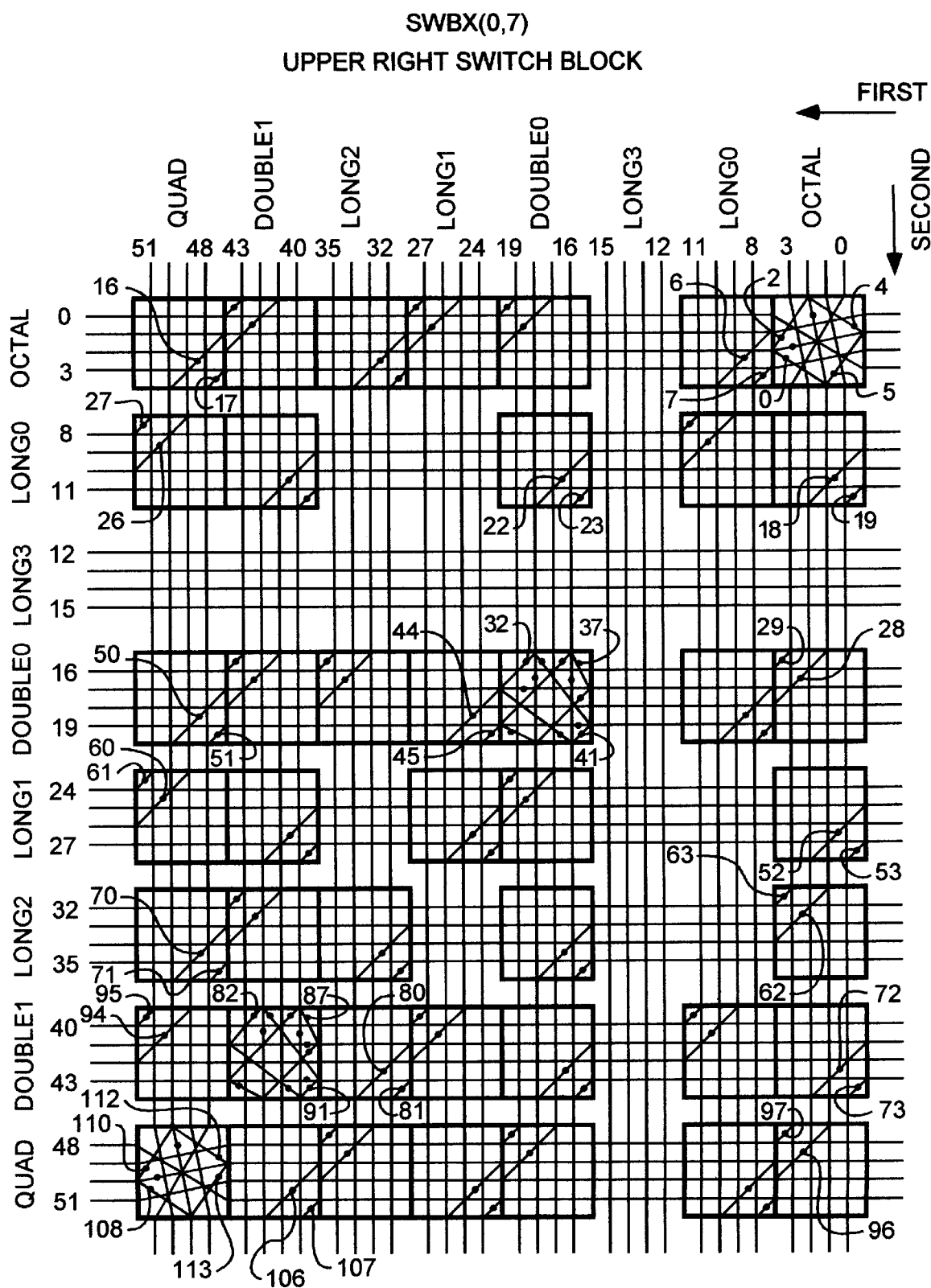
Figure 3C:
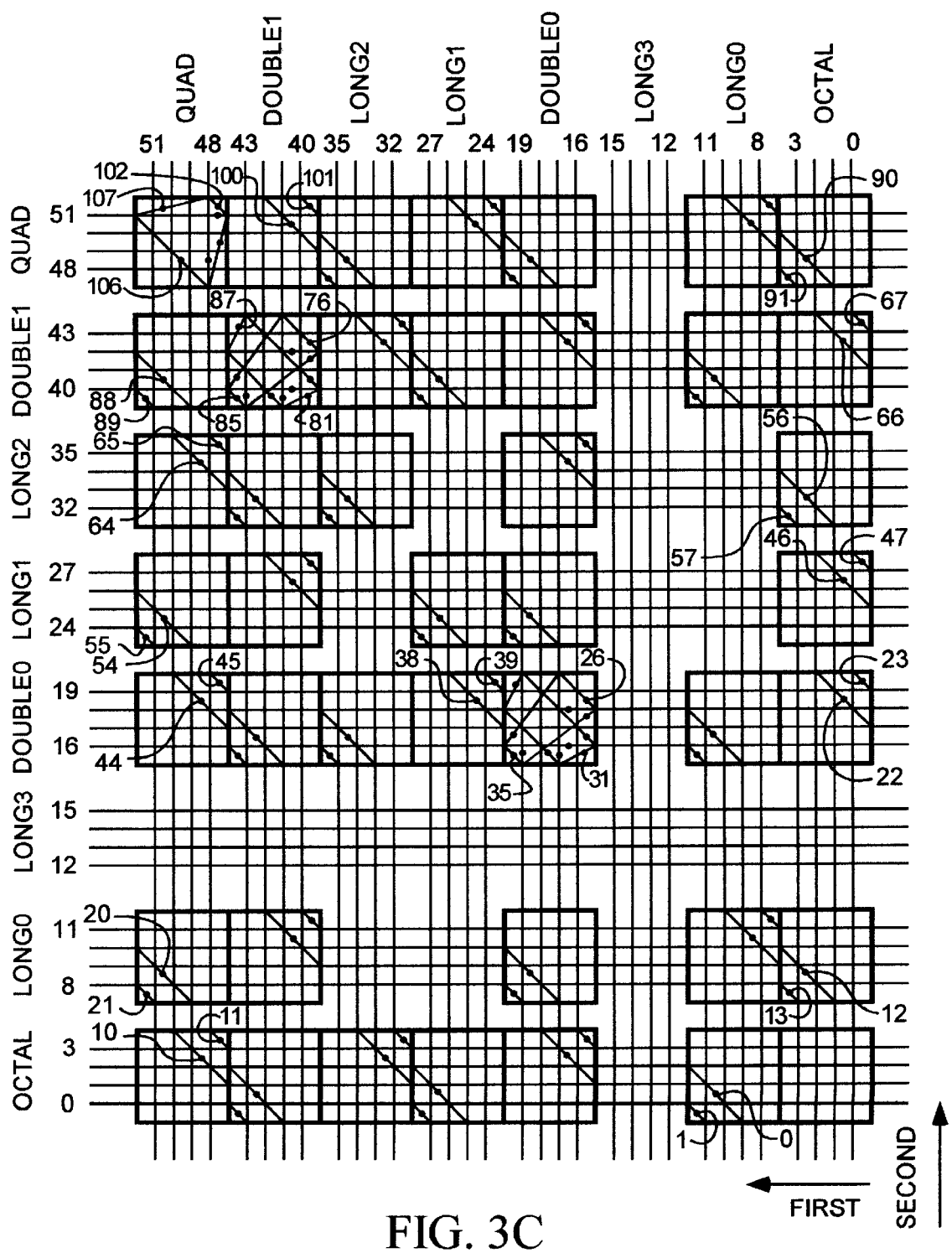
Figure 3D:
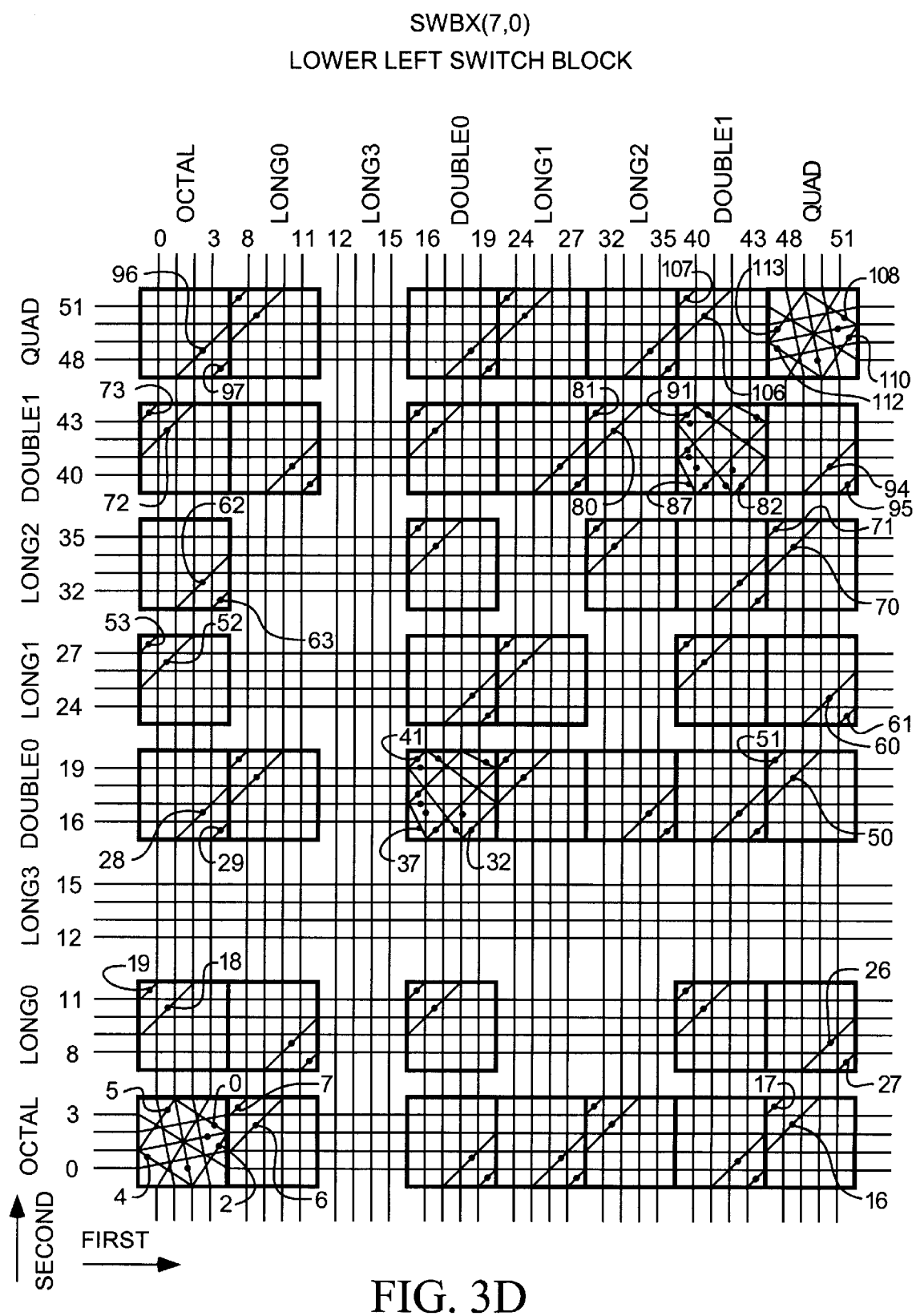

FIGS. 3B, 3C, and 3D illustrate upper right switch box SwBx (0,7), lower right switch box SwBx (7,7), and lower left switch box SwBx (7,0), respectively. Switch boxes SwBx (0,7), (7,7), and (7,0) also have similar stubs for providing control signals as illustrated in FIG. 3A and described above.

Figure 5:
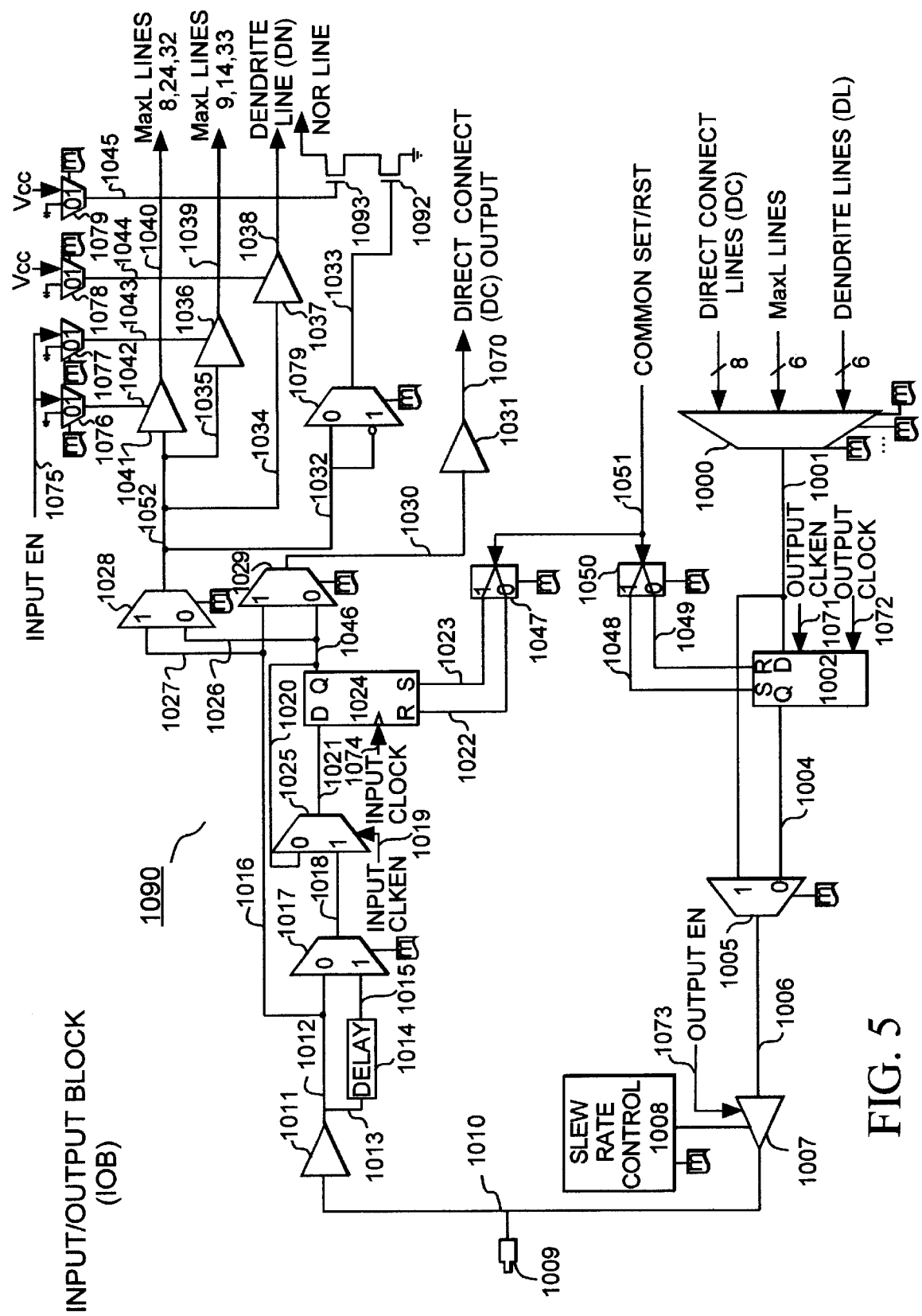
FIG. 5 illustrates an IOB architecture.

FIG. 5 illustrates an IOB 1090 corresponding to one of the 96 IOBs positioned on the periphery of FPGA device 800 illustrated in FIG. 1.

IOB 1090 provides a configurable inter-connection between the input/output pin 1009 and the inter-connect resources. The inter-connect resources may supply signals as inputs to IOB 1090. In particular, the inter-connect resources connected to input multiplexer 1000 include 8 direct connect (DC) lines, 6 MaxL lines, and 6 (DN) dendrite lines. The inter-connect resources connected to IOB outputs include two MaxL lines, one dendrite (DN) line, one NOR line, and one direct connect (DC) line. Line 1040 and 1039 are connected to MaxL lines. Line 1038 is connected to a dendrite (DN) line. Line 1033 controls a NOR line. Line 1070 is connected to a direct connect (DC) line.

Control input signals to IOB 1090 includes INPUT EN, INPUT CLOCK, INPUT CLKEN, OUTPUT EN, OUTPUT CLOCK, OUTPUT CLKEN and COMMON SET/RST signals. These control signals are obtained by IOB control multiplexers illustrated in FIGS. 6A–6E and described below. An INPUT EN signal is input on line 1075 to multiplexers 1076 and 1077, which in turn generates signals on lines 1042 and 1043 enabling output drive amplifiers 1041 and 1036 to output signals on MaxL lines. In an embodiment, drivers 1041 and 1036 are tri-state drivers. Specific IOB output connections to MaxL lines are described in the above-identified patent application entitled "INPUT/OUTPUT BLOCK (IOB) CONNECTIONS TO MAXL LINES, NOR LINES AND DENDRITES IN FPGA INTEGRATED CIRCUITS", incorporated by reference herein. An INPUT CLOCK signal is input on line 1074 to input register/latch 1024 and is used to clock a configurable input register/latch 1024. A CLKEN signal is input on line 1019 to multiplexer 1025. A COMMON SET/RST signal is input on line 1051 to decoder 1047 and 1050 in order to set or reset configurable register/latch 1024. An OUTPUT CLOCK signal is input to output register 1002 on line 1072 in order to clock register 1002. A CLKEN signal is also input to register 1002 on line 1071. An OUTPUT EN signal is input on line 1073 to amplifier 1007 in order to enable signals output from amplifier 1007.

As illustrated in FIG. 5, many of the multiplexer and decoder outputs are selected by programmable memory bits in a configuration memory.

The input signals to IOB 1090 from inter-connect resources and dendrites are input to multiplexer 1000 which generates signals on line 1001 to output register 1002. Output register 1002 is clocked by an OUTPUT CLOCK signal on line 1072. The set and reset function of output register 1002 is selected by signals on lines 1048 and 1049, respectively. The COMMON SET/RST signal is input on line 1051 to decoder 1050, which then outputs a SET or RST signal on lines 1048 or 1049 in response to configuration memory programmed for decoder 1050 and COMMON SET/RST signal. The output of output register 1002 is supplied to line 1004. Line 1004 and line 1001 are connected to multiplexer 1005. The output of multiplexer 1005 is coupled to amplifier 1007 by line 1006. The amplifier 1007 has a slew rate control circuit 1008 as known in the art. The slew rate control circuit 1008 allows the output to either have a fast or slow rise time subject to the state of the memory bit controlling that function. Likewise, the amplifier 1007 has the OUTPUT EN signal supplied on line 1073.

The output of amplifier 1007 is connected to pin 1009 by line 1010.

An input signal to IOB 1090 may be received from pin 1009 and passed to amplifier 1011 on line 1010. The output of a signal from amplifier 1011 is input to multiplexer 1017 on line 1012 or to delay element 1014 on line 1013. In an embodiment, delay element 1014 is a chain of inverters with large channel lengths for pull down transistors. Delay element 1014 is used to delay incoming signals which may be generated by a peripheral device coupled to pin 1009. The delay may be necessary in order to provide approximately zero hold time for register/latch 1024. A global clock may be used as an INPUT CLOCK signal for register/latch 1024. The global clock signal may not reach register/latch 1024 before a data signal is provided to the D input of register/latch 1024. For example, the global clock may take approximately 2.3 nanoseconds to be provided to register/latch 1024 where a data signal from pin 1009 to register/latch 1024 may take approximately 0.7 nanoseconds. Thus, a variable delay 1014 is used to set up or time the data signal to register/latch 1024 when using a global clock. If the INPUT CLOCK is obtained externally or from an adjacent IOB, delay element 1014 may be bypassed. Likewise, if the input signal is intended to be a direct connect signal output on line 1070, delay element 1014 may be bypassed. Further, the use of Phase-Lock-Loop (PLL) and clock tree would eliminate the delay associated with a global clock signal and allow delay 1014 to be bypassed.

Signals from delay element 1014 are input to multiplexer 1017 on line 1015. The output of amplifier 1011 is also output on line 1016 to multiplexer 1029. The output of multiplexer 1017 is input to multiplexer 1025 on line 1018. A feedback signal may be provided as an input to multiplexer 1025 from configurable input register/latch 1024 on line 1020. Multiplexer 1025 is controlled by a CLKEN signal. The output of multiplexer 1025 is input to configurable input register/latch 1024 on line 1021.

Configurable input register/latch 1024, as with register 1002, is controlled by a SET and RST signal on lines 1023 and 1022, respectively. The input of configurable input register/latch 1024 is clocked by an INPUT CLOCK signal on line 1074. A COMMON SET/RST signal and predetermined configuration memory bit setting determining whether a signal is generated on line 1023 or line 1022.

Configurable input register/latch 1024 can be configured to operate either as a latch or a register, in response to a memory bit setting in configuration memory. When the input register/latch 1024 operates as a register, data at the input D is transferred to the output Q on the rising edge of the OUTPUT CLOCK signal on line 1072 or INPUT CLOCK signal on line 1074. When the input register/latch 1024 operates as a latch, any data change at D is seen at Q while the signal on line 1074 is high. When the signal on line 1074 returns to the low state, the output Q is frozen in the present state, and any change on D will not affect the condition of Q. A COMMON SET/RST signal may be generated from a VGB to all IOBs or to a set of IOBs in order to set or reset latch 1024. A COMMON SET/RST signal may also be generated by peripheral device coupled to the FPGA device.

The output of register/latch 1024 is input to multiplexer 1029 by line 1046. Multiplexer 1028 also has inputs from lines 1027 and 1026.

The IOB outputs to inter-connect resources are supplied on line 1052 from multiplexer 1028 and on line 1030 from multiplexer 1029. A NOR line may also be controlled by generating a signal on line 1032. MaxL, DN, or NOR output signals to predetermined inter-connect lines are determined by signals from multiplexers 1076, 1077, and 1078, and 1079. Configuration memories coupled to multiplexers 1076, 1077, and 1078 and the multiplexers inputs determine whether signals generated on lines 1042–45 enable output drive amplifiers 1041, 1036, and 1038. For example, an IOB output signal may be supplied to either MaxL lines 8, 24 or 32 on line 1040 from output drive amplifier 1041 in response to an inputted signal on line 1052 and a control signal on line 1042. Line 1042 is connected to the output of multiplexer 1076. Ground and line 1075 which may carry an INPUT EN signal are connected to multiplexer 1076 inputs. An IOB output signal may likewise be generated on either MaxL lines 9, 14, or 33, from output drive amplifier 1036. Output drive amplifier 1036 outputs a signal in response to a control signal on line 1043 and an input on line 1035. Likewise, control signals generated on line 1043 to output drive amplifier 1036 are generated by multiplexer 1077 which has two inputs, ground and an INPUT EN signal on line 1075.

An IOB output signal to a dendrite line is supplied from output drive amplifier 1037 on line 1038. Amplifier 1037 is enabled based on a control signal on line 1044. Line 1044 is coupled to drive amplifier 1037 and multiplexer 1078. The inputs of multiplexer 1078 include ground and a $V_{CC}$.

In an embodiment, amplifiers 1041 and 1036 are tri-state drivers sized to drive MaxL lines. Amplifiers 1038 and 1031 are also sized to drive a dendrite and a direct connect line, respectively.

An IOB output signal controls an adjacent NOR line by generating a signal on line 1032 to multiplexer 1079. The output of multiplexer 1079 is output to line 1033 which is coupled to a means for providing a ground path for current on the adjacent NOR line. In an embodiment, the means for providing a ground path includes transistors 1093 and 1092. Line 1033 is coupled to a the gate of transistor 1092. The drain of transistor 1092 is coupled to ground. The drain of transistor 1093 is coupled to the source of transistor 1092. The source of transistor 1093 is coupled to a NOR line. The gate of transistor 1093 is coupled to line 1045. Multiplexer 1079 supplies a control signal to line 1045 responses to inputs (ground, $V_{CC}$) and a configuration memory bit.

A NOR line is illustrated and described in the above-identified patent application entitled "INPUT/OUTPUT BLOCK (IOB) CONNECTIONS TO MAXL LINES, NOR LINES AND DENDRITES IN FPGA INTEGRATED CIRCUITS", which is incorporated by reference herein.

A direct connect output from IOB 1090 is generated on line 1070 from amplifier 1031. Amplifier 1031 is connected to multiplexer 1029 by line 1030. A direct connect architecture is illustrated and described in the above-identified patent application entitled "FLEXIBLE DIRECT CONNECTIONS BETWEEN INPUT/OUTPUT BLOCKS (IOBs) AND VARIABLE GRAIN BLOCKS (VGBs) IN FPGA INTEGRATED CIRCUITS", which is incorporated by reference herein.

Figure 6A:
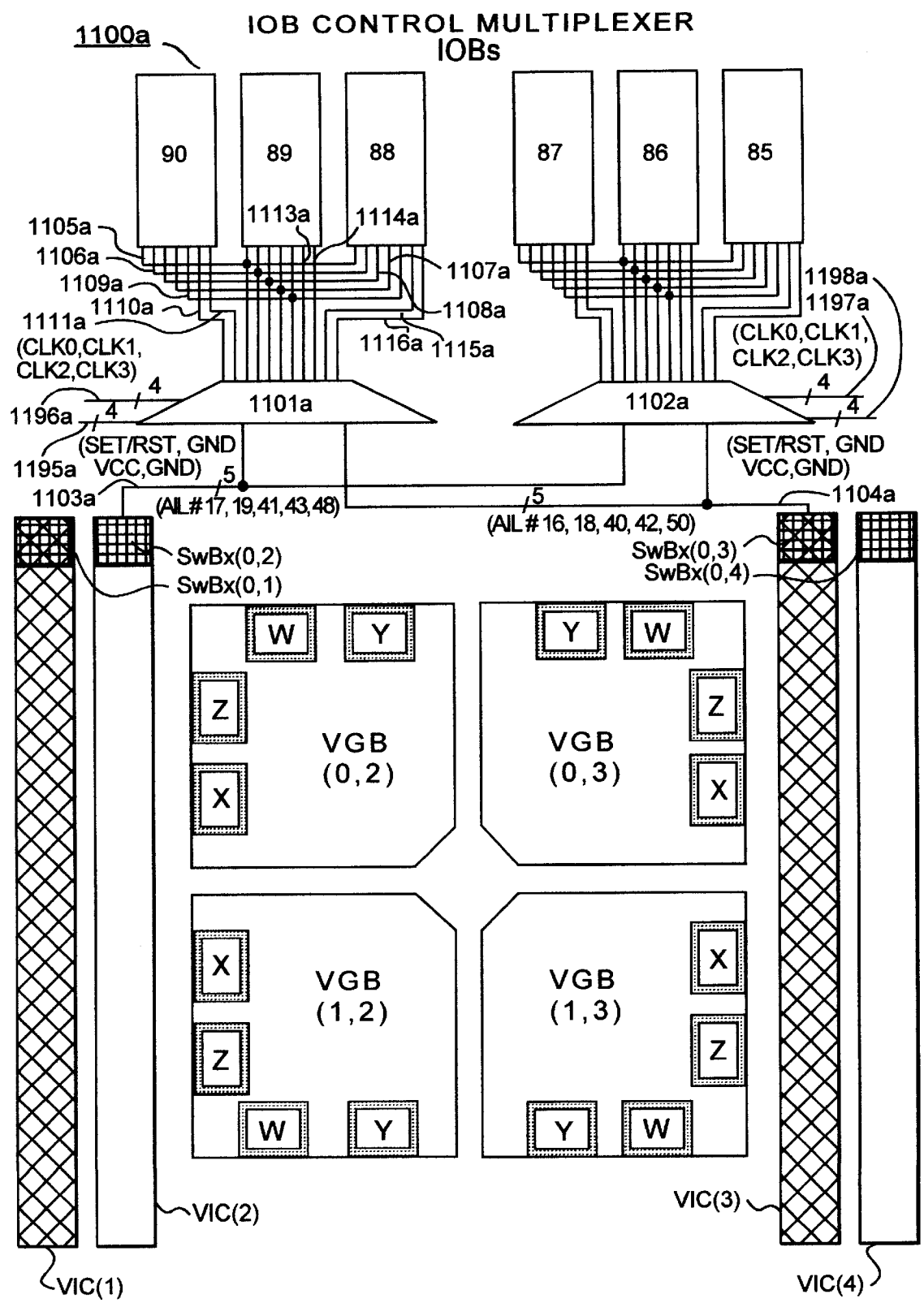
FIG. 6A illustrates an IOB control multiplexer.

FIG. 6A illustrates IOB control multiplexer architecture 1100a used to supply control signals to IOBs as illustrated in FIG. 1. FIG. 6A illustrates a microscopic view of FIG. 1 and shows the positioning of IOB control multiplexers 1101a. As can be seen in FIG. 6A, IOB control multiplexers 1101a and 1102a are associated with pairs of 3 IOBs. FIG. 6A illustrates IOB control multiplexer 1101a associated with IOBs 90, 89, and 88. Likewise, IOB control multiplexer 1102a is associated with IOBs 87, 86, and 85. IOB control multiplexers 1101a and 1102a are used to supply common and individual control signals to IOBs. Inputs to IOB control multiplexers 1101a and 1102a are supplied from left and right vertical inter-connect channels as well as lines for global signals such as CLKX and GND. It should be understood that a similar positioning of IOB control multiplexers for groups of 3 IOBs are repeated about the right, bottom and left side of FPGA device 800. In this embodiment, the left vertical inter-connect channel illustrated in FIG. 6A is VIC(2). Likewise, the right vertical inter-connect channel illustrated in FIG. 6A is VIC(3). Inputs to IOB control multiplexers 1101a and 1102a include 5 lines from associated SwBx (0,2) and 5 lines from associated SwBx (0,3). The 5 lines from SwBx (0,2) is represented by reference line 1103a while the 5 lines from SwBx (0,3) is represented by reference line 1104a. CLKX signals, in particular CLK0, CLK1, CLK2, and CLK3, are input on lines 1196a and 1197a to multiplexers 1101a and 1102a, respectively. Similarly, SET/RST, VCC and GND signals are input on lines 1195a and 1198a to multiplexers 1101a and 1102a, respectively. FIGS. 6B–E illustrate the particular 18 lines input from an associated switch box and other lines to IOB control multiplexers 1101a and 1102a. FIGS. 6B–E also illustrates the PIP locations for connecting the 18 lines from an associated switch box and other lines to particular MILs in a control multiplexer positioned about the top, right, bottom or left side of FPGA device 800. In one embodiment, clear and shaded PIPs are used.

Figure 6B:
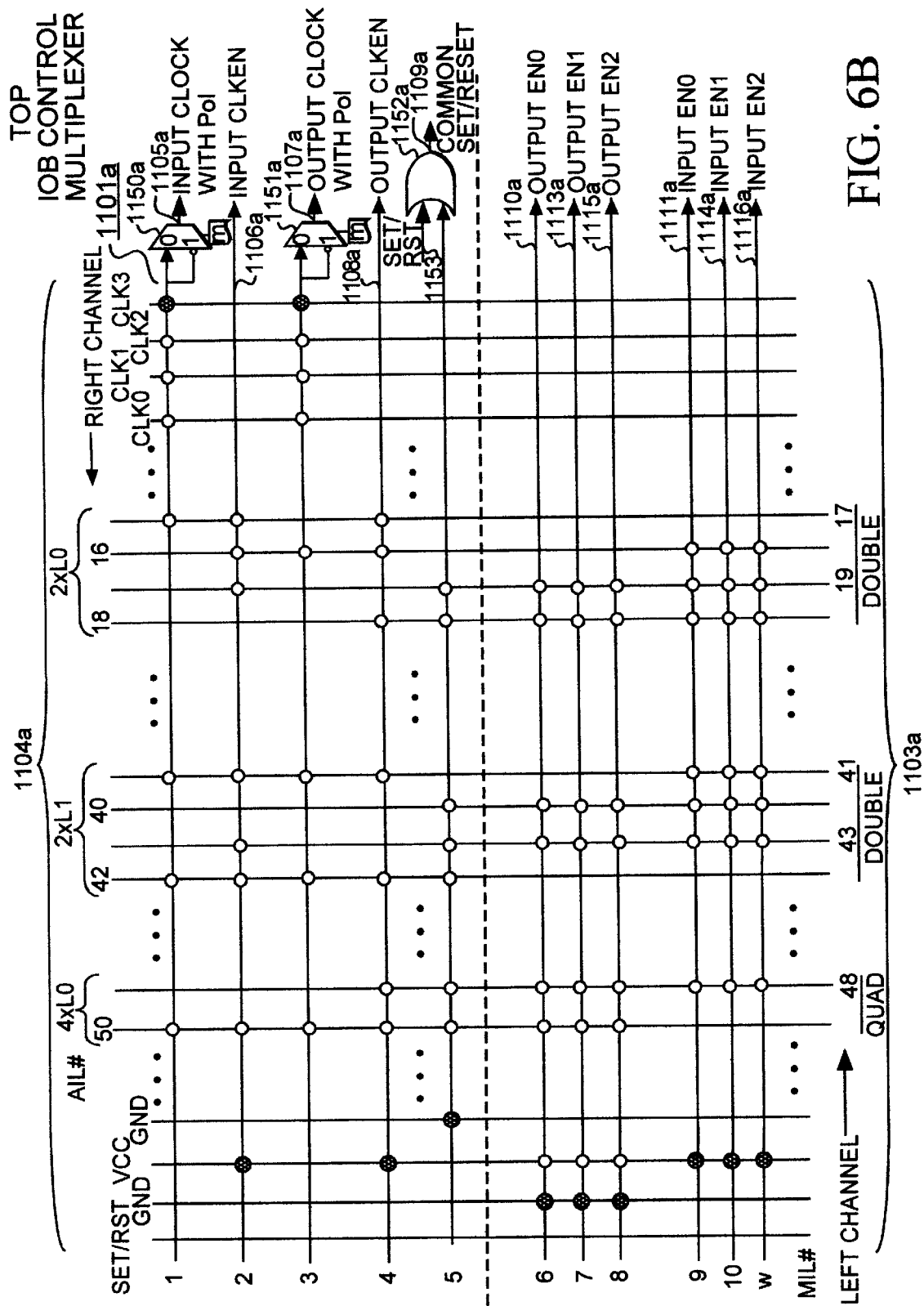
FIG. 6B illustrates a top IOB control multiplexer.

FIG. 6B illustrates a detailed representation of a control multiplexer positioned about the top of FPGA device 800, such as top control multiplexer 1101a as illustrated in FIG. 6A. IOB control multiplexer 1101a is used to configurably connect vertical and horizontal inter-connect resources to top IOBs, such as IOBs 9088. The upper portion of FIG. 6B (above the dashed line) illustrates programmable connections between vertical inter-connect lines in a right channel, such as VIC(3), and MILs in top control multiplexer 1101a. The bottom half (under the dashed line) illustrates programmable connections between vertical inter-connect lines in a left channel, such as VIC(2) and MILs in top control multiplexer 1101a. In particular, top IOBs may be selectively connected to a SET/RST line, two GND lines, and a $V_{CC}$ line. Further, the top IOBs may be selectively coupled to quad (4×Lo) and double lines (2×L1 and 2×Lo) in a left channel, such as VIC(1), (3), (5). Also, the top IOBs may be selectively coupled to CLK 0–3 lines.

IOB control multiplexers 1101a includes MILs #1–11, PIPs, and Logic (multiplexers, NOR gate). MIL #1 and a complimentary line is connected to multiplexer 1150a. Multiplexer 1150a is also coupled to configuration memory bit. Multiplexer 1150a outputs an INPUT CLOCK signal on line 1105a which is coupled to top IOBs 90–88 as illustrated in FIG. 6A. MIL #2 is used for inputting an INPUT CLKEN signal on line 1106a which is coupled to top IOBs 90–88. MIL #3 and its complimentary line, like MIL #1, is coupled to multiplexer 1151a. The output of multiplexer 1151a is then used to supply an OUTPUT CLOCK signal to top IOBs 90–88 on line 1107a. MIL #4 is used to carry an OUTPUT CLKEN signal to top IOBs 90–88 on line 1108a. MIL #5 is connected to NOR gate 1152a along with line 1153. Line 1153 carries a SET/RST signal. The output of NOR gate 1152 is coupled to the top IOBs 90–88 and is used to carry a COMMON SET/RST signal on line 1109a.

AILs #50, 42, 41, 17 from the left and right channels and CLK 0–3 are programmably configurable to MIL #1 by respective PIPs. $V_{CC}$ line, AILs #50, 42, 43, 41, 19, 16, and 17 from both the right and left channels may also be programmably configured to MIL #2.

AILs #50, 42, 41, and 16 and CLK 0–3 may be programmably configured to MIL #3. $V_{CC}$ line, AILs #50, 48, 42, 41, 18, 16, and 17 from both the right and left channels may be programmably configured to MIL #4. GND line, AILs #50, 48, 42, 43, 40, 18, and 19 from both the right and left channels may be programmably configured to MIL #5.

The lower portion of FIG. 6B illustrates connections between inter-connect lines in a left and right channel, or in particular VIC(2) and VIC(3), in top IOB control multiplexers 1101a. In particular, MIL #6, 7, and 8 are used to output individual IOB control signals OUTPUT EN0, OUTPUT EN1, OUTPUT EN2 to a first, second, third and top IOB, for example IOBs 90, 89, and 88 as illustrated in FIGS. 1 and 6A. MILs #9, 10, 11 are used to output individual IOB control signals INPUT EN0, INPUT EN1, INPUT EN2 to a first, second, and third top IOB, for example IOB 90, 89, and 88 as illustrated in FIGS. 1 and 6A. PIPs connect GND line, $V_{CC}$ line, AILs #50, 48, 43, 40, 18, and 19 to MIL #6. Line 1110*a* connects MIL #6 to IOB 90. PIPs connect GND line, $V_{CC}$ line, AILs #50, 48, 43, 40, 18 and 19 to MIL #7. PIPs connect GND line, $V_{CC}$ line, AILs #50, 48, 43, 40, 18, and 19 to MIL #8. Line 1115*a* connects MIL #8 to IOB 88. PIPs connect $V_{CC}$, AILs #48, 43, 40, 41, 18, 19 and 16 to MIL #9. Line 1111*a* connects MIL #9 to IOB 90. PIPs connect $V_{CC}$, AILs #48, 43, 40, 41, 18, 19 and 16 to MIL #10. Line 1114*a* connects MIL #10 to IOB 89. PIPs connect $V_{CC}$, AILs #48, 43, 40, 41, 18, 19 and 16 to MIL #11. Line 1116*a* connects MIL #11 to IOB 88.

Figure 6C:
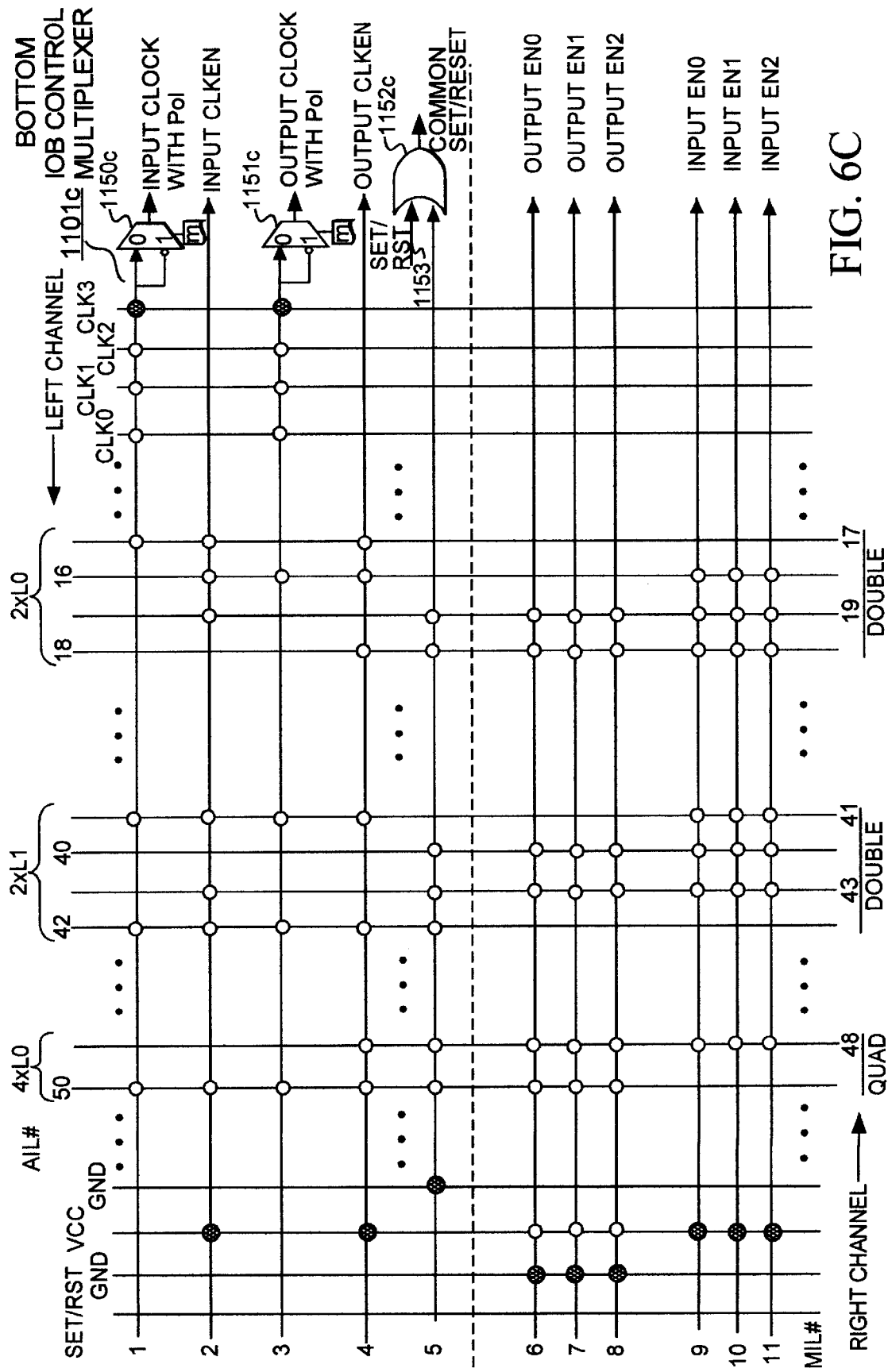
FIG. 6C illustrates a bottom IOB control multiplexer.

FIG. 6C illustrates a control multiplexer adjacent bottom IOBs, such as IOBs 31–33 illustrated in FIG. 1. In this embodiment, the left channel corresponds to VIC(2) and the right channel corresponds to VIC(3). Lines in the right and left inter-connect channels are similarly programmably configured to MILs by PIPs to output individual and common control signals to bottom IOBs.

Figure 6D:
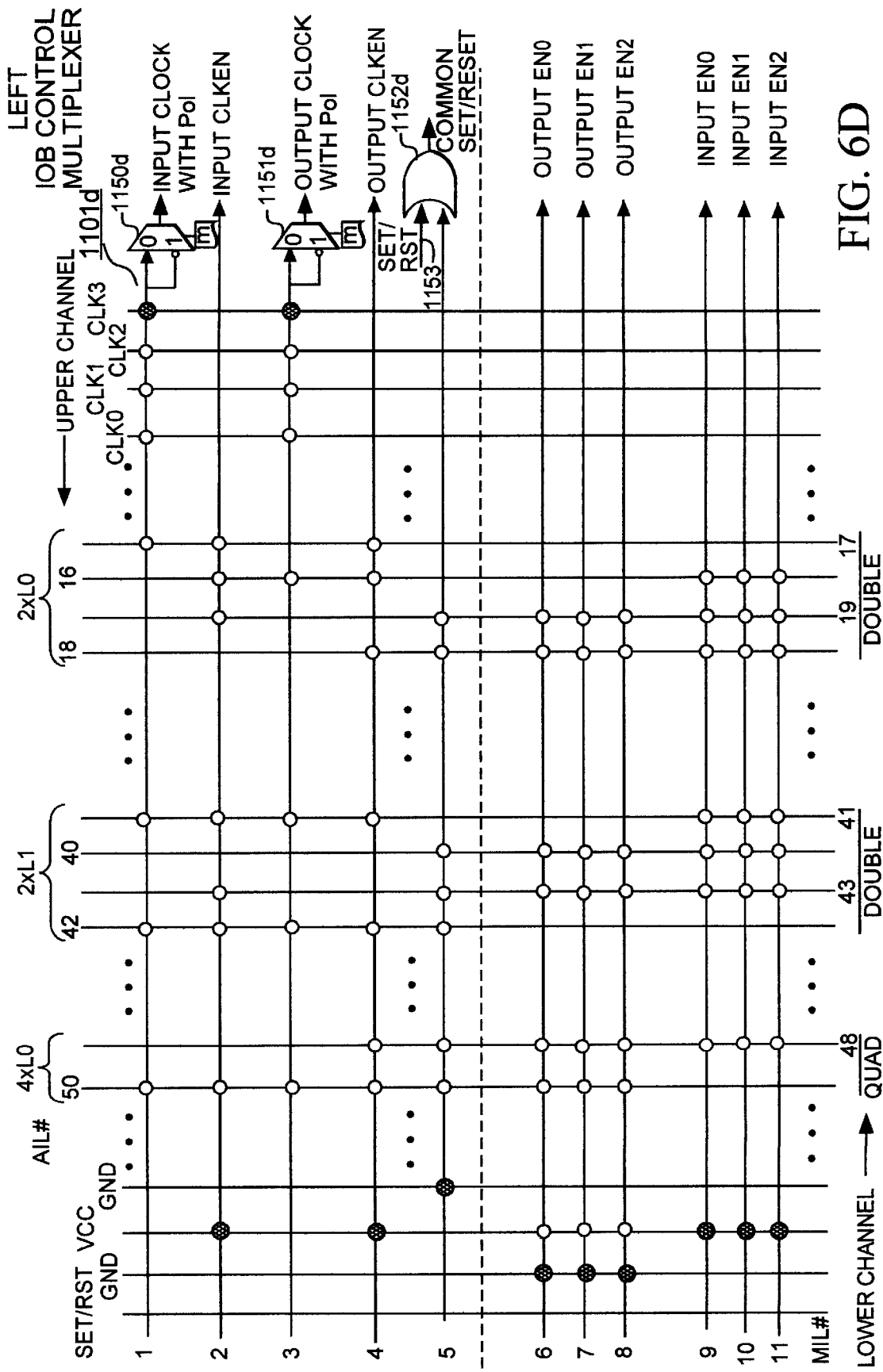
FIG. 6D illustrates a left IOB control multiplexer.

FIG. 6D illustrates a control multiplexer adjacent IOBs positioned about the left side of FPGA device 800 illustrated in FIG. 1, such as IOBs 7–9. In this embodiment, the upper channel corresponds to HIC(2) and the lower channel corresponds to HIC(3). Lines in the upper and lower channels are similarly programmably configured to MILs to output individual and common control signals to left IOB.

Figure 6E:
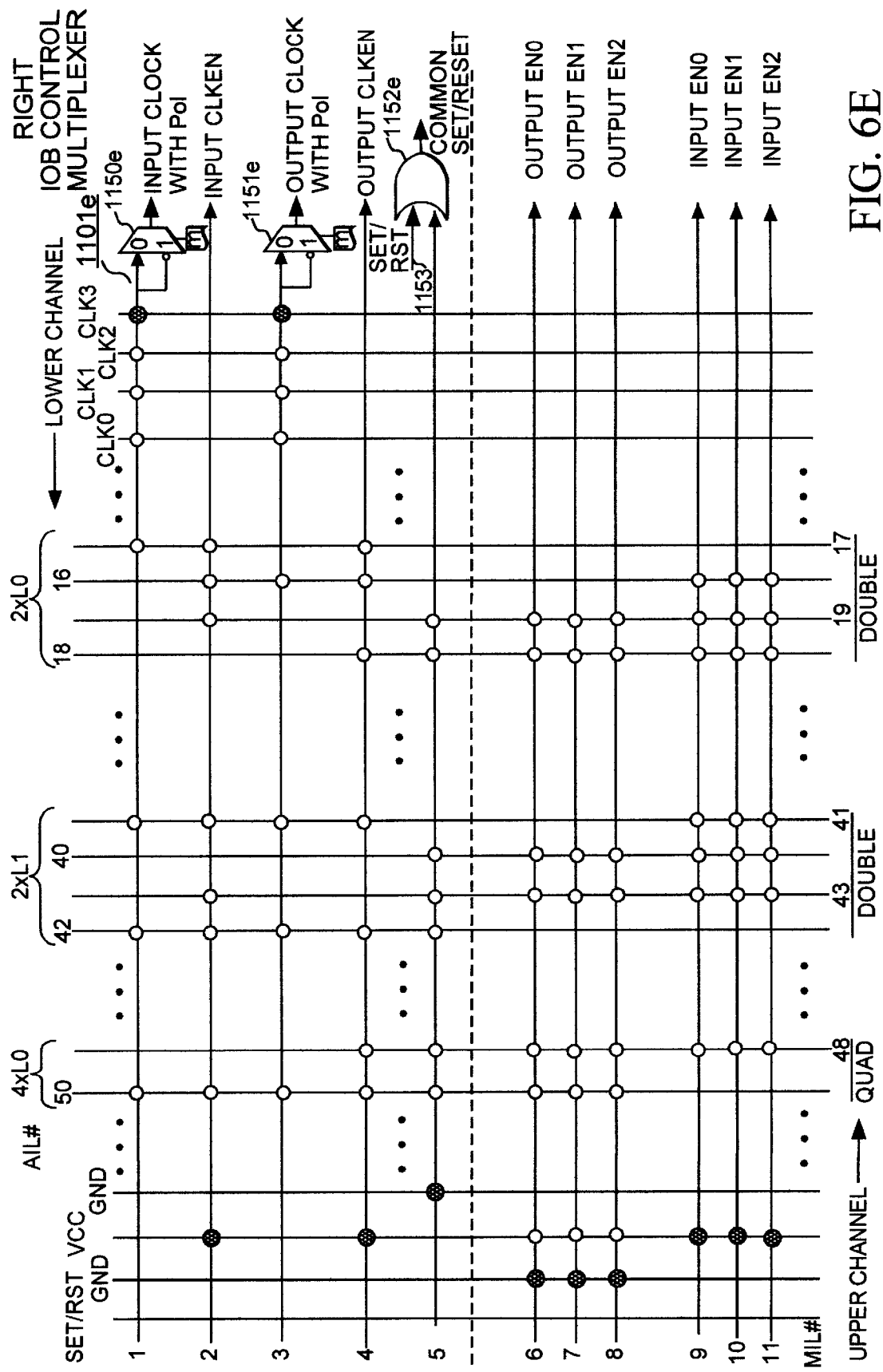
FIG. 6E illustrates a right IOB control multiplexer.

FIG. 6E illustrates a control multiplexer adjacent IOBs positioned about the right side of FPGA device 800 illustrated in FIG. 1, such as IOBs 66–64. In this embodiment, the lower channel corresponds to HIC(3) and the upper channel corresponds to HIC(2). Lines in the upper and lower channels are similarly programmably configured to MILs to output individual and common control signals to right IOBs.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A field programmable gate array (FPGA) device, comprising:
   (a) a plurality of IOBs;
   (b) a first multiplexer, coupled to a first set of IOBs in the plurality of IOBs, for providing a first selected control signal to the first set of IOBs;
   (c) a second multiplexer, coupled to a second set of IOBs in a plurality of IOBs for providing the first selected control signal to the second set of IOBs, wherein the first and the second multiplexers are different;
   (d) a first switch box, coupled to the first multiplexer, having a first line segment;
   (e) a second switch box, coupled to the second multiplexer, having a first line segment; and
   (f) a first inter-connect channel, coupled to the first line segments of the first and second switch boxes, for providing a first control signal to the first and second multiplexers.

2. The FPGA device of claim 1, wherein the first set of IOBs include 3 IOBs and the second set of IOBs include 3 IOBs.

3. The FPGA device of claim 1, wherein the first multiplexer includes a logic gate.

4. The FPGA device of claim 1, wherein the first inter-connect channel is a vertical inter-connect channel.

5. The FPGA device of claim 1, wherein the first selected control signal is a common control signal.

6. The FPGA device of claim 2, wherein the first inter-connect channel includes a double length line, quad length line and octal length line.

7. The FPGA device of claim 1, wherein the first line segment of the first switch box does not have PIPs positioned on the first line segment.

8. The FPGA device of claim 1, wherein the first switch box is a corner switch box.

9. The FPGA device of claim 1, wherein the first switch box further includes a second line segment having a length different from the first line segment and a third line segment having a length different from the first and second line segments.

10. The FPGA device of claim 9, wherein the first line segment is positioned substantially perpendicular to the second line segment.

11. The FPGA device of claim 1, wherein the first multiplexer includes a plurality of PIPs.

* * * * *